(12) United States Patent
Kuang et al.

(10) Patent No.: US 12,513,952 B2
(45) Date of Patent: Dec. 30, 2025

(54) METHOD FOR FABRICATING A SEMICONDUCTOR DEVICE INCLUDING ETCHING NANOSTRUCTURES

(71) Applicant: Taiwan Semiconductor Manufacturing Company, Ltd., Hsinchu (TW)

(72) Inventors: Chia-Chien Kuang, Hsinchu (TW); Wei-Lun Chen, Taipei (TW); Tze-Chung Lin, Hsinchu (TW); Li-Te Lin, Hsinchu (TW)

(73) Assignee: Taiwan Semiconducor Manufacturing Company, Ltd., Hsinchu (TW)

( * ) Notice: Subject to any disclaimer, the term of this patent is extended or adjusted under 35 U.S.C. 154(b) by 650 days.

(21) Appl. No.: 17/689,644

(22) Filed: Mar. 8, 2022

(65) Prior Publication Data

US 2023/0027676 A1    Jan. 26, 2023

Related U.S. Application Data

(60) Provisional application No. 63/224,684, filed on Jul. 22, 2021.

(51) Int. Cl.
*H10D 62/10* (2025.01)
*H01L 21/306* (2006.01)
(Continued)

(52) U.S. Cl.
CPC ..... *H10D 62/121* (2025.01); *H01L 21/30621* (2013.01); *H01L 21/762* (2013.01);
(Continued)

(58) Field of Classification Search
CPC .......... H01L 29/0673; H01L 29/42392; H01L 21/30621; H01L 21/823481; H01L 21/823468; H01L 21/3065; H10D 84/038; H10D 84/0151; H10D 84/013; H10D 84/014; H10D 84/0128; H10D 62/121; H10D 30/6375; H10D 30/43; H10D 30/6713; H10D 30/6735; H10D 30/6757; H10D 64/017
See application file for complete search history.

(56) References Cited

U.S. PATENT DOCUMENTS 9,093,530 B2   7/2015 Huang et al.
9,171,929 B2  10/2015 Lee et al.
(Continued)

*Primary Examiner* — Khiem D Nguyen
(74) *Attorney, Agent, or Firm* — Sterne, Kessler, Goldstein & Fox P.L.L.C.

(57) ABSTRACT

The present disclosure describes a semiconductor device with substantially uniform gate regions and a method for forming the same. The method includes forming a fin structure on a substrate, the fin structure including one or more nanostructures. The method further includes removing a portion of the fin structure to expose an end of the one or more nanostructures and etching the end of the one or more nanostructures with one or more etching cycles. Each etching cycle includes purging the fin structure with hydrogen fluoride (HF), etching the end of the one or more nanostructures with a gas mixture of fluorine ($F_2$) and HF, and removing an exhaust gas mixture including an etching byproduct. The method further includes forming an inner spacer in the etched end of the one or more nanostructures.

20 Claims, 13 Drawing Sheets

(51) Int. Cl.
    *H01L 21/762*     (2006.01)
    *H10D 30/67*     (2025.01)
    *H10D 84/01*     (2025.01)
    *H10D 84/03*     (2025.01)

(52) U.S. Cl.
    CPC ..... *H10D 30/6713* (2025.01); *H10D 30/6735* (2025.01); *H10D 30/6757* (2025.01); *H10D 84/0128* (2025.01); *H10D 84/013* (2025.01); *H10D 84/0151* (2025.01); *H10D 84/038* (2025.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2018/0040733 A1* | 2/2018 | Chang .................. H10D 30/024 |
| 2018/0315837 A1* | 11/2018 | Fung .................... H10D 84/038 |
| 2020/0365692 A1* | 11/2020 | Jung .................... H01L 29/0673 |
| 2021/0083074 A1* | 3/2021 | Yang .................... H10D 30/0243 |
| 2021/0202756 A1* | 7/2021 | Chang .................. H10D 64/018 |
| 2021/0202758 A1* | 7/2021 | Yeong ............... H01L 29/66553 |

* cited by examiner

METHOD FOR FABRICATING A SEMICONDUCTOR DEVICE INCLUDING ETCHING NANOSTRUCTURES

CROSS-REFERENCE TO RELATED APPLICATION

This application claims the benefit of U.S. Provisional Patent Application No. 63/224,684, filed on Jul. 22, 2021 and titled "A Method of Uniform SiGe Partial Etch in Si Nanosheet Fabrication," the disclosure of which is incorporated by reference herein in its entirety.

BACKGROUND

With advances in semiconductor technology, there has been increasing demand for higher storage capacity, faster processing systems, higher performance, and lower costs. To meet this demand, the semiconductor industry continues to scale down the dimensions of semiconductor devices with three-dimensional transistors, such as gate-all-around (GAA) field effect transistors (FETs) and fin field effect transistors (finFETs).

BRIEF DESCRIPTION OF THE DRAWINGS

Aspects of the present disclosure are best understood from the following detailed description when read with the accompanying figures.

DETAILED DESCRIPTION

Figure 1A:
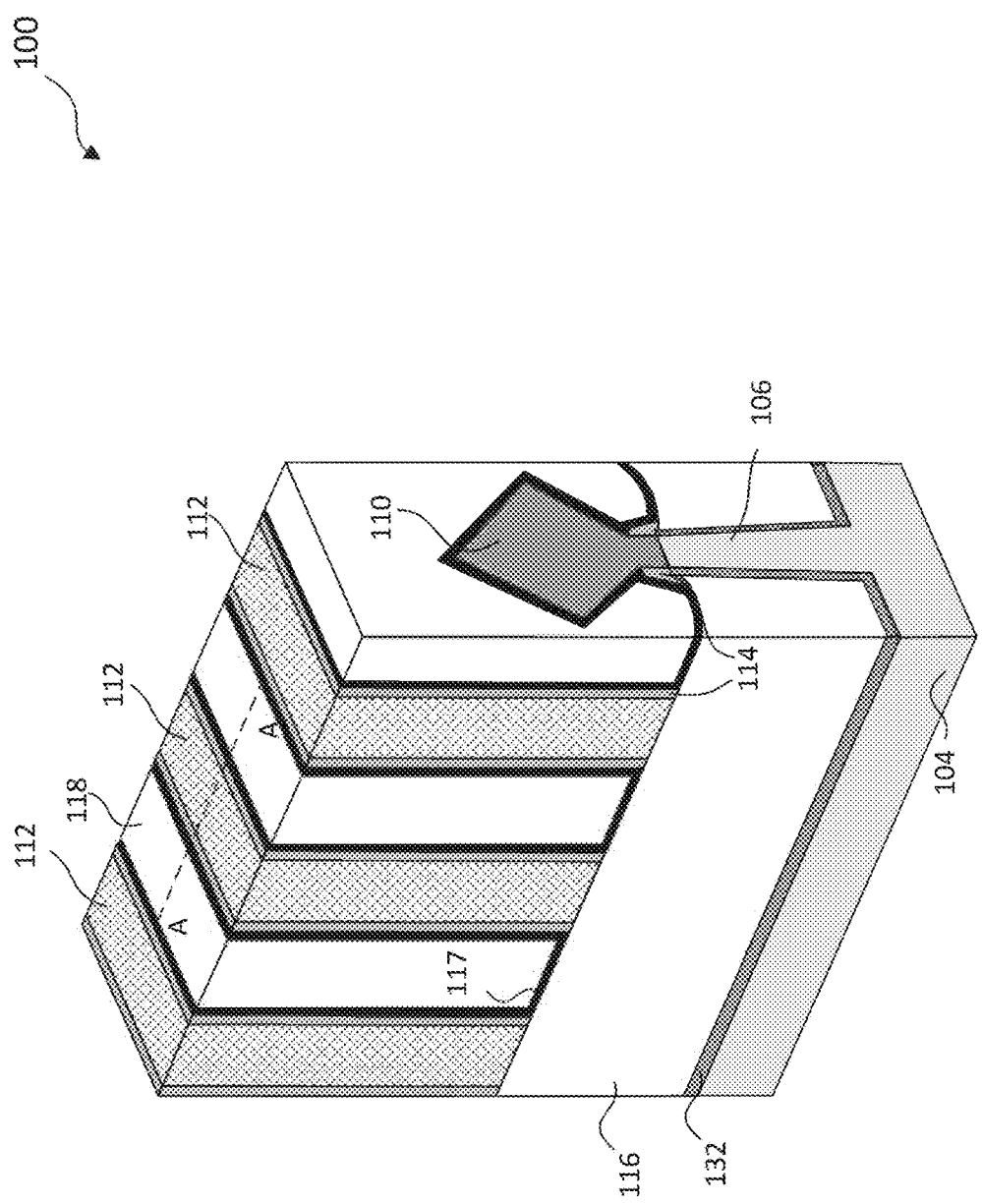
FIG. 1A illustrates an isometric view of a semiconductor device with substantially uniform gate regions, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A, 1B, 3-6A, 7-11A, and 12 with the same annotations applies to each other, unless mentioned otherwise.

As the semiconductor industry continues to scale down the dimensions of semiconductor devices, circuit complexity has increased at all device levels. Gate-all-around (GAA) field effect transistors (FETs) and fin field effect transistors (finFETs) increase device density and improve device performance. GAA FETs and finFETs include a pair of source/drain (S/D) regions formed on opposite sides of a channel region and a gate structure formed on the channel region. GAA FETs further include one or more gate regions, an inner spacer disposed at the ends of the gate regions, and one or more nanosheet/nanowire channels. The nanosheet/nanowire channels can be silicon (Si). The inner spacer and gate regions can be formed in a space previously occupied by silicon germanium (SiGe) nanostructures. Challenges can exist in the etching of the SiGe nanostructures. Etching of SiGe at a high temperature can cause Si nanosheet/nanowire channel loss. Etching of SiGe with fluorine ($F_2$) can cause high surface roughness in SiGe and at Si/SiGe interface. Introducing gaseous hydrogen fluoride (HF) can make the surfaces smoother but can cause etching and critical dimension (CD) non-uniformities. The etching and CD non-uniformities can be between top and bottom SiGe nanostructures. For example, the etching amount can be greater at the bottom SiGe nanostructure compared with the top SiGe nanostructure. The etching and CD non-uniformities can also be between fin structures with different spacings. For example, the etching amount can be greater within fin structures with a smaller spacing than within fin structures with a larger spacing. The etching and CD non-uniformities can result in non-uniform gate regions. The etching non-uniformity can result in voids formed between the inner spacer and the gate regions. The etching non-uniformity can also result in non-uniform inner spacer thicknesses. Non-uniform gate regions can reduce device performance and reliability.

The present disclosure provides example FET devices (e.g., GAA FETs, finFETs, and planar FETs) with substantially uniform gate regions in a semiconductor device and/or in an integrated circuit (IC) and an example method for fabricating the same. The substantially uniform gate regions can be formed when the etching and CD non-uniformities are reduced. The etching and CD non-uniformities can be reduced by adjusting the etching processes. When etching the ends of the SiGe nanostructures, a native oxide removal operation can be performed to remove the native oxide on the surfaces of the SiGe nanostructures to expose SiGe for etching. Removing the native oxide can improve the etching uniformity. A HF purge operation can be performed to remove the residues resulting from the native oxide removal operation. The HF purge operation can treat the surfaces of the SiGe nanostructures. The treatment of the surfaces of the SiGe nanostructures can improve etch uniformity and improve the surface roughness after etching. A $F_2$/HF etch operation can be performed to remove the ends and the middle portions of the SiGe nanostructures. The substrate to be etched can be maintained at a low temperature such that Si nanosheet/nanowire channel loss can be reduced. The $F_2$/HF etchant gas mixture can be supplied at a low rate and the pressure in the etching chamber can be maintained at a low pressure such that the etching and CD non-uniformities can be reduced and the SiGe surface and Si/SiGe interface roughness can be improved. The ratio between $F_2$ and HF can be between about 0.02 and about 0.6. In some embodiments, diluted $F_2$ with either Ar or $N_2$ can be used with the $F_2$/Ar or $F_2$/$N_2$ volume ratio between about 10% and about 30%. The ratio between $F_2$ and HF is calculated with the actual $F_2$ flowrate applied, not the flowrate of the $F_2$/Ar or $F_2$/$N_2$ gas mixture. If the ratio between $F_2$ and HF is greater than about 0.6, the SiGe surface and Si/SiGe interface roughness can be too great. If the ratio between $F_2$ and HF is lower than about 0.02, the etching and CD non-uniformities can be too great. An etch byproduct removal operation can be performed to remove the byproducts generated in the $F_2$/HF etch operation. The etch byproduct removal operation can be performed by a vacuum mechanism. The etch byproduct removal operation can improve etching uniformity and surface roughness.

After a cycle of HF purge, $F_2$/HF etch, and etch byproduct removal, if the etching amount is below a predetermined threshold, one or more additional cycles of HF purge, $F_2$/HF etch, and etch byproduct removal can be performed. In some embodiments, residual $F_2$/HF can remain in the etching chamber after the $F_2$/HF etch operation. The etch byproduct removal operation can remove the residual $F_2$/HF and ensure that the ratio between $F_2$ and HF for the next cycle is within the predetermined range. Multiple cycles of low-temperature and low-pressure etching for each cycle can reduce the etching and CD non-uniformities. Reduced etching non-uniformity can result in less voids when the inner spacer is formed. Both the inner spacer and the gate regions to be formed in the space previously occupied by the SiGe nanostructures can have improved uniformity. The substantially uniform gate regions can improve device performance and reliability.

Figure 1B:
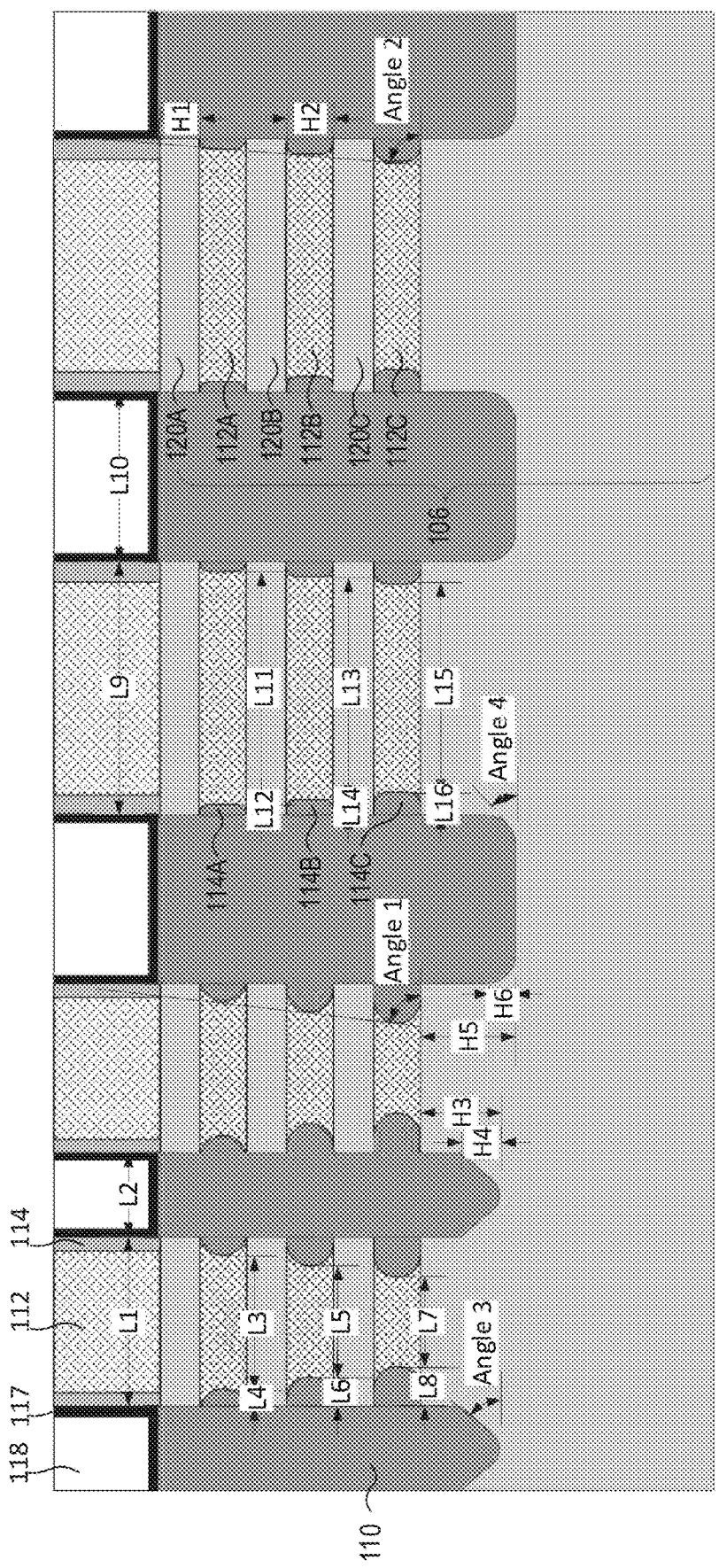
FIG. 1B illustrates a cross-sectional view of a semiconductor device with substantially uniform gate regions, in accordance with some embodiments.

According to some embodiments, FIG. 1A illustrates an isometric view of a FET 100. In some embodiments, FET 100 can represent a finFET 100 and a GAA FET 100. In some embodiments, FET 100 can represent n-type FET 100 (NFET 100) and p-type FET 100 (PFET 100) and the discussion of FET 100 applies to both NFET 100 and PFET 100, unless mentioned otherwise. FIG. 1B illustrates a cross-sectional view of GAA FET 100 along an X-axis showing relative positions between S/D regions 110, gate structures 112, and gate regions 112A-112C. The discussion of elements in FIGS. 1A and 1B with the same annotations applies to each other, unless mentioned otherwise.

Referring to FIGS. 1A and 1B, FET 100 can include gate structures 112 disposed on fin structures 106. Referring to FIG. 1B, GAA FET 100 can include gate regions 112A-112C disposed between nanostructured channel layers 120A-120C and on fin structures 106. Referring to FIGS. 1A and 1B, FET 100 can include S/D regions 110 disposed on portions of fin structures 106 that are adjacent to gate structures 112. FET 100 can further include gate spacers 114, shallow trench isolation (STI) regions 116, and liner layers 132. In some embodiments, gate spacers 114 can include multiple layers. FET 100 can further include etch stop layers (ESLs) 117 and interlayer dielectric (ILD) layers 118. ILD layers 118 can be disposed on ESLs 117. Referring to FIG. 1B, GAA FET 100 can further include inner spacers 114A-114C. In some embodiments, gate spacers 114, inner spacers 114A-114C, STI regions 116, liner layers 132, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$).

Referring to FIG. 1A, FET 100 can be formed on a substrate 104. There can be other FETs and/or structures (e.g., isolation structures) formed on substrate 104. Substrate 104 can be a semiconductor material, such as Si, germanium (Ge), SiGe, a silicon-on-insulator (SOI) structure, and a combination thereof. Further, substrate 104 can be doped with p-type dopants, such as boron (B), indium (In), aluminum (Al), and gallium (Ga), or n-type dopants, such as phosphorous (P) and arsenic (As). In some embodiments, fin structures 106 can include a material similar to substrate 104 and extend along an X-axis.

Referring to FIG. 1B, in some embodiments, FET 100 can include nanostructured channel layers 120A-120C. Nanostructured channel layers 120A-120C can be above, below, and interposed between gate regions 112A-112C. Nanostructured channel layers 120A-120C can include a semiconductor material, similar to or different from substrate 104. Nanostructured channel layers 120A-120C can include a semiconductor material, similar to fin structures 106 and S/D regions 110. In some embodiments, nanostructured channel layers 120A-120C can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, and other suitable semiconductor materials. Nanostructured channel layers 120A-120C can be nanosheets and nanowires. Nanostructured channel layers 120A-120C can have cross-sections of other geometric shapes, such as circular, elliptical, triangular, and polygonal shapes.

Referring to FIGS. 1A and 1B, in some embodiments, gate structures 112 and gate regions 112A-112C can be multi-layered structures. The multi-layers of gate structures 112 and gate regions 112A-112C are not shown in FIGS. 1A and 1B for simplicity. Each of gate structures 112 and gate regions 112A-112C can include an interfacial oxide (IO) layer, a high-k (HK) gate dielectric layer disposed on IO layer, and a conductive layer disposed on the HK gate dielectric layer. The IO layers can include $SiO_x$, $SiGeO_x$, and germanium oxide ($GeO_x$). The HK gate dielectric layers can include an HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The conductive layers can be multi-layered structures. Each of the conductive layers can include a work function metal (WFM) layer disposed on the HK gate dielectric layer, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, and a combination thereof. In some embodiments, the WFM layers can include substantially Al-free (e.g., with no Al) Ti-based and Ta-based nitrides and alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A and 1B, for NFET 100, each of S/D regions 110 can include an epitaxially-grown semiconductor material, such as Si and SiGe, and n-type dopants, such as P and other suitable n-type dopants. For PFET 100, each of S/D regions 110 can include an epitaxially-grown semiconductor material, such as Si and SiGe, and p-type dopants, such as B and other suitable p-type dopants. A dopant concentration can be in a range from about $1\times10^{20}$ atoms/$cm^3$ to about $3\times10^{22}$ atoms/$cm^3$ in each of S/D regions 110. In some embodiments, S/D regions 110 can have a height of about 50 nm to about 70 nm. In some embodiments, S/D regions 110 can have a tapered shape at the bottom. A height H3 and H5 of S/D regions 110 below gate region 112C can be between about 2 nm and about 20 nm. A height H4 and H6 of the tapered portion of S/D regions 110 can be between about 0.5 nm and about 10 nm. A ratio H4/H3 and H6/H5 can be between about 0.02 and about 0.6. An angle 3 between a horizontal line (e.g., in the x-direction) and a line along the tapered boundary of S/D regions 110 can be between about 20 degrees and about 90 degrees. An angle 4 between a horizontal line (e.g., in the x-direction) and a line along the tapered boundary of S/D regions 110 can be between about 10 degrees and about 90 degrees.

Referring to FIGS. 1A and 1B, in some embodiments, fin structures 106 can have a small width and a small spacing. Referring to FIG. 1B, in some embodiments, fin structures 106 can have a width L1 between about 30 nm and about 40 nm, and a spacing L2 between about 15 nm and 20 nm. In some embodiments, fin structures 106 can have a large width and a large spacing. Referring to FIG. 1B, in some embodiments, fin structures 106 can have a width L9 between about 120 nm and about 140 nm, and a spacing L10 between about 30 nm and 40 nm. The different widths and spacings of fin structures 106 can cause the etching and CD non-uniformities between different fin structures 106. Fin structures 106 with a smaller width and spacing can have a greater etching amount. Fin structures 106 with a larger width and spacing can have a smaller etching amount. There can also be etching and CD non-uniformities between the top portion of fin structures 106 and the bottom portion of fin structures 106. The top portion of fin structures 106 can have a smaller etching amount. The bottom portion of fin structures 106 can have a greater etching amount. The etching and CD non-uniformities can cause inner spacers 114A-114C and gate regions 112A-112C to have CD variations. Non-uniform gate regions 112A-112C can reduce device performance and reliability.

Referring to FIG. 1B, for fin structures 106 having a small width and a small spacing, inner spacers 114A-114C can have a width L4, L6, and L8 between about 5 nm and about 10 nm. A difference between widths of adjacent inner spacers 114A-114C, such as L6-L4 and L8-L6, can be between about −1 nm and about 1 nm, between about −1.5 nm and about 1.5 nm, and between about −2 nm and about 2 nm. If L6-L4 and L8-L6 is less than about −2 nm or greater than about 2 nm, gate regions 112A-112C can be non-uniform and device performance and reliability can be reduced. Referring to FIG. 1B, gate regions 112A-112C can have a width L3, L5, and L7 between about 10 nm and about 20 nm. A difference between widths of adjacent gate regions 112A-112C, such as L5-L3 and L7-L5, can be between about −2 nm and about 2 nm, between about −3 nm and about 3 nm, and between about −4 nm and about 4 nm. If L5-L3 and L7-L5 is less than about −4 nm or greater than about 4 nm, gate regions 112A-112C can be non-uniform and device performance and reliability can be reduced. A ratio between adjacent gate region widths, such as L3/L5 and L5/L7, can be between about 0.97 and about 1.03, between about 0.95 and about 1.05, and between about 0.9 and about 1.1. If the ratio L3/L5 and L5/L7 is less than about 0.9 or greater than about 1.1, gate regions 112A-112C can be non-uniform and device performance and reliability can be reduced. A ratio between inner spacer width difference, such as L6-L4, and gate region width, such as L3, can be between about −0.1 and about 0.1, between about −0.15 and about 0.15, and between about −0.2 and about 0.2. If the ratio (L6-L4)/L3 is less than about −0.2 or greater than about 0.2, gate regions 112A-112C can be non-uniform and device performance and reliability can be reduced.

Referring to FIG. 1B, for fin structures 106 having a small width and a small spacing, an angle 1 between a horizontal line (e.g., in the x-direction) and a line connecting inner spacers 114A-114C can be between about 85 degrees and about 95 degrees, between about 83 degrees and about 97 degrees, and between about 80 degrees and about 100 degrees. If angle 1 is less than about 80 degrees or greater than about 100 degrees, gate regions 112A-112C can be non-uniform and device performance and reliability can be reduced.

Referring to FIG. 1B, for fin structures 106 having a large width and a large spacing, inner spacers 114A-114C can have a width L12, L14, and L16 between about 5 nm and about 10 nm. A difference between widths of adjacent inner spacers 114A-114C, such as L14-L12 and L16-L14, can be between about −1 nm and about 1 nm, between about −1.5 nm and about 1.5 nm, and between about −2 nm and about 2 nm. If L14-L12 and L16-L14 is less than about −2 nm or greater than about 2 nm, gate regions 112A-112C can be non-uniform and device performance and reliability can be reduced. Referring to FIG. 1B, gate regions 112A-112C can have a width L11, L13, and L15 between about 100 nm and about 120 nm. A difference between widths of adjacent gate regions 112A-112C, such as L13-L11 and L15-L13, can be between about −2 nm and about 2 nm, between about −3 nm and about 3 nm, and between about −4 nm and about 4 nm. If L13-L11 and L15-L13 is less than about −4 nm or greater than about 4 nm, gate regions 112A-112C can be non-uniform and device performance and reliability can be reduced. A ratio between adjacent gate region widths, such as L11/L13 and L13/L15, can be between about 0.97 and about 1.03, between about 0.95 and about 1.05, and between about 0.9 and about 1.1. If the ratio L11/L13 and L13/L15 is less than about 0.9 or greater than about 1.1, gate regions 112A-112C can be non-uniform and device performance and reliability can be reduced. A ratio between inner spacer width difference, such as L14-L12, and gate region width, such as L11, can be between about −0.03 and about 0.03, between about −0.04 and about 0.04, and between about −0.05 and about 0.05. If the ratio (L14-L12)/L11 is less than about −0.05 or greater than about 0.05, gate regions 112A-112C can be non-uniform and device performance and reliability can be reduced.

Referring to FIG. 1B, for fin structures 106 having a large width and a large spacing, an angle 2 between a horizontal line (e.g., in the x-direction) and a line connecting inner spacers 114A-114C can be between about 87 degrees and about 93 degrees, between about 85 degrees and about 95 degrees, and between about 83 degrees and about 97 degrees. If angle 2 is less than about 83 degrees or greater than about 97 degrees, gate regions 112A-112C can be non-uniform and device performance and reliability can be reduced.

Referring to FIG. 1B, between fin structures 106 having different widths and different spacings, a difference between widths of inner spacers 114A-114C at the same height, such as L12-L4, L14-L6, and L16-L8, can be between about −2 nm and about 2 nm, between about −3 nm and about 3 nm, and between about −5 nm and about 5 nm. If L12-L4, L14-L6, and L16-L8 is less than about −5 nm or greater than about 5 nm, gate regions 112A-112C can be non-uniform and device performance and reliability can be reduced. A ratio between inner spacer width difference, such as L12-L4, and gate region width, such as L11, can be between about −0.05 and about 0.05, between about −0.07 and about 0.07, and between about −0.1 and about 0.1. If the ratio (L12-L4)/L11 is less than about −0.1 or greater than about 0.1, gate regions 112A-112C can be non-uniform and device performance and reliability can be reduced.

Referring to FIG. 1B, a height H1 of nanostructured channel layers 120A-120C can be between about 5 nm and about 10 nm. A height H2 of gate regions 112A-112C can be between about 5 nm and about 10 nm. A difference between H1 and H2, such as H1-H2, can be between about −2 nm and about 2 nm. A ratio between Si channel loss and H1 can be less than about 0.06, less than about 0.15, and less than about 0.3. If the ratio between Si channel loss and H1 is greater than about 0.3, the Si channel loss can be too great and device performance and reliability can be reduced.

Figure 2:
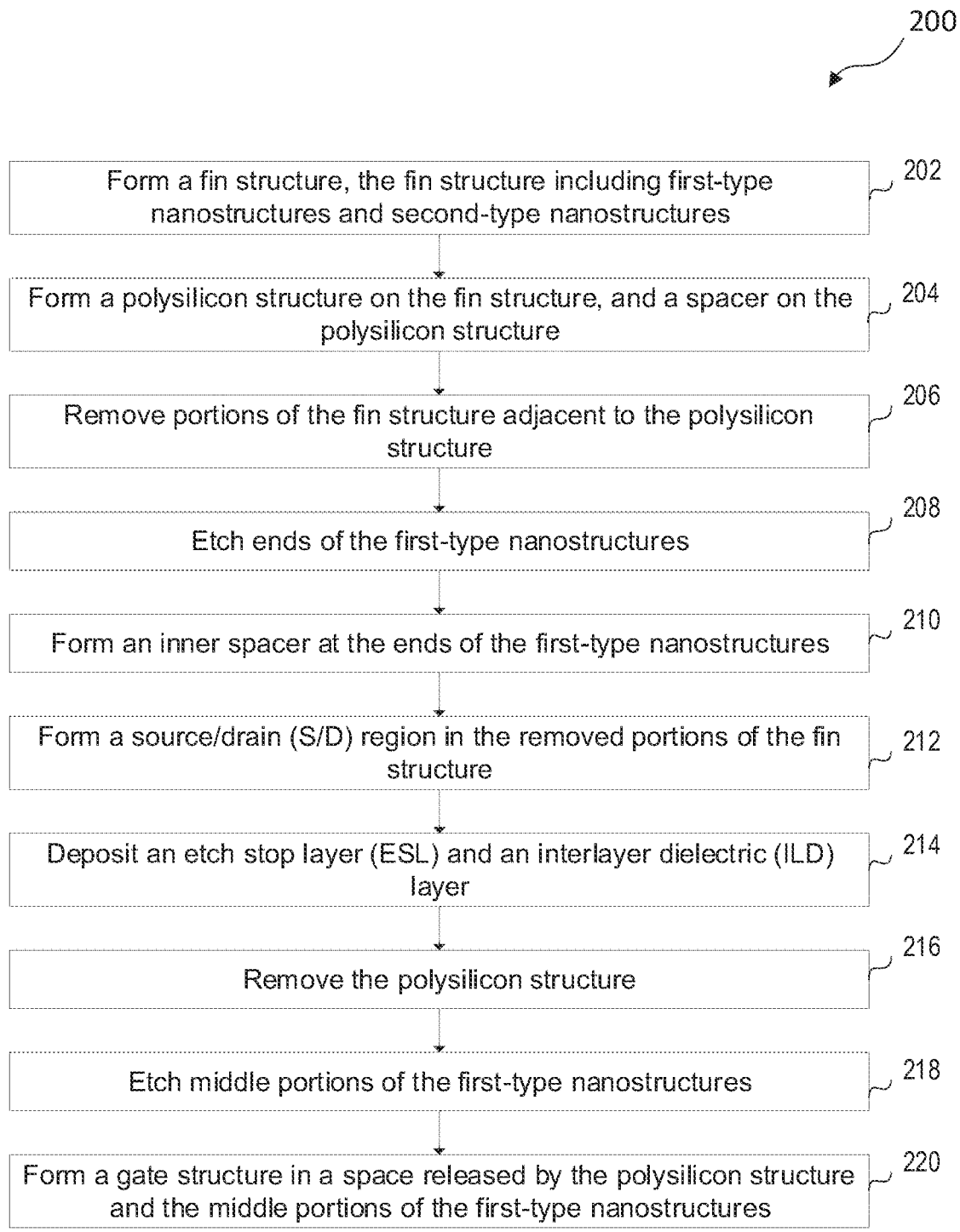
FIG. 2 is a flow diagram of a method for fabricating a semiconductor device with substantially uniform gate regions, in accordance with some embodiments.

According to some embodiments, FIG. 2 is a flow diagram describing a method 200 for fabricating FET 100, as shown in FIGS. 1A and 1B. For illustrative purposes, the operations illustrated in FIG. 2 will be described with reference to the example fabrication process for fabricating FET 100 as illustrated in FIGS. 3-12. FIGS. 3-6A, 7-11A, and 12 are cross-sectional views of FET 100 along line A-A of FIG. 1A at various stages of fabrication, according to some embodiments. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. It should be noted that method 200 may not produce a complete FET 100. Accordingly, it is understood that additional processes can be provided before, during, and after method 200, and that some other processes may only be briefly described herein. Elements in FIGS. 3-6A, 7-11A, and 12 with the same annotations as elements in FIGS. 1A and 1B are described above.

Figure 3:
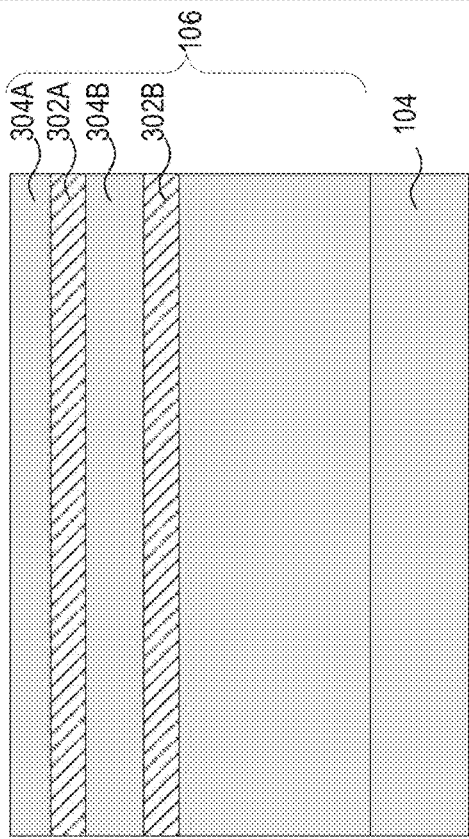
Figure 3:
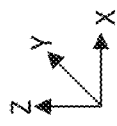

Referring to FIG. 2, in operation 202, a fin structure is formed on a substrate. In some embodiments, the fin structure can be formed with first-type nanostructures and second-type nanostructures. For example, as shown in FIG. 3, fin structure 106 is formed on substrate 104, and fin structure 106 includes first-type nanostructures 302A and 302B and second-type nanostructures 304A and 304B. Fin structure 106 can be patterned by any suitable method. For example, fin structure 106 can be patterned using one or more photolithography processes, including double-patterning and multi-patterning processes. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over substrate 104 and patterned using a photolithography process. Spacers are formed alongside the patterned sacrificial layer using a self-aligned process. The sacrificial layer is then removed, and the remaining spacers may then be used to pattern fin structure 106.

Figure 4:
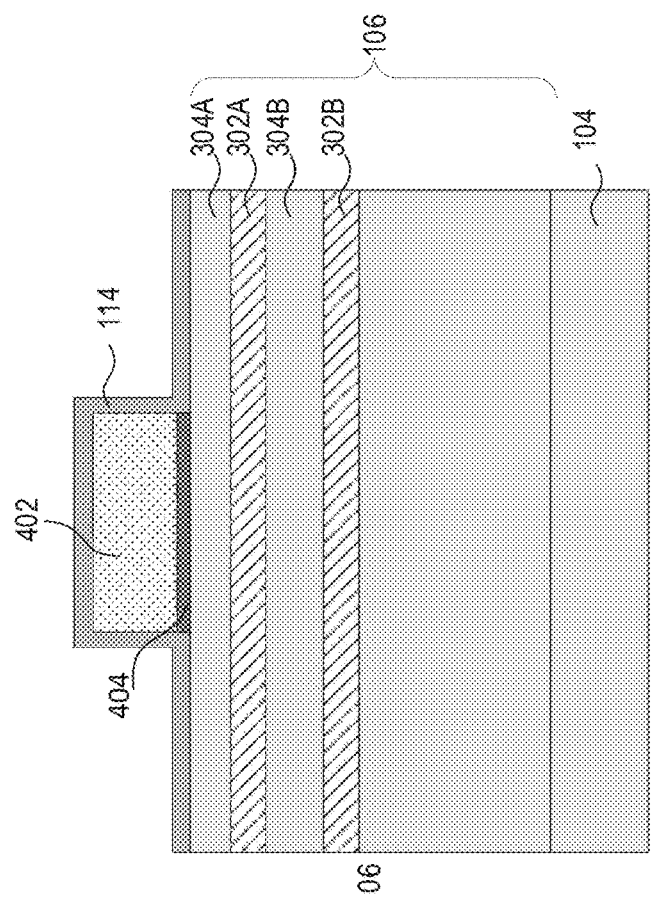
FIGS. 3-12 illustrate cross-sectional views of a semiconductor device with substantially uniform gate regions at various stages of its fabrication process, in accordance with some embodiments.
Figure 4:
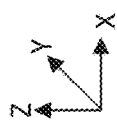

Referring to FIG. 2, in operation 204, a polysilicon structure is formed on the fin structure and a spacer is formed on the polysilicon structure. For example, as shown in FIG. 4, polysilicon structure 402 is formed on fin structure 106, and spacer 114 is formed on polysilicon structure 402. In some embodiments, interfacial oxide layer 404 can be formed below polysilicon structure 402. The formation of polysilicon structure 402 can include blanket depositing a layer of polysilicon material over fin structure 106 using chemical vapor deposition (CVD), physical vapor deposition (PVD), atomic layer deposition (ALD), and other suitable deposition processes, and removing portions of the layer of polysilicon material using a photolithographic patterning process. The formation of spacer 114 can include blanket depositing a layer of an insulating material (e.g., an oxide and a nitride material) over fin structure 106 and polysilicon structure 402 by a CVD, a PVD, and an ALD process followed by an etching process (e.g., reactive ion etching and other dry etching processes using a chlorine (Cl) and fluorine (F) based etchant).

Figure 5:
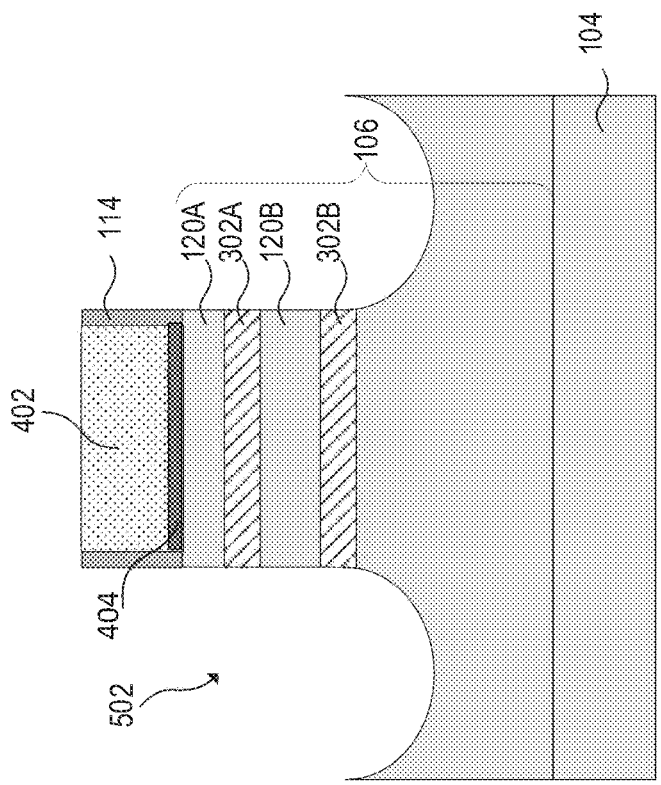

Referring to FIG. 2, in operation 206, portions of the fin structure adjacent to the polysilicon structure are removed. For example, as shown in FIG. 5, portions of fin structure 106 adjacent to polysilicon structure 402 are removed to form recess openings 502. Recess openings 502 can be formed by a dry etching process (e.g., reactive ion etching process). The dry etching process can use a gas mixture having $C_xF_y$, $N_2$, and Ar. Recess openings 502 can be formed by a wet etching process, additionally and/or alternatively. The wet etching process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and a combination thereof. The etching process can be a selective etching and a timed etching. Nanostructured channel layers 120A and 120B can be formed by second-type nanostructures 304A and 304B.

Figure 6B:
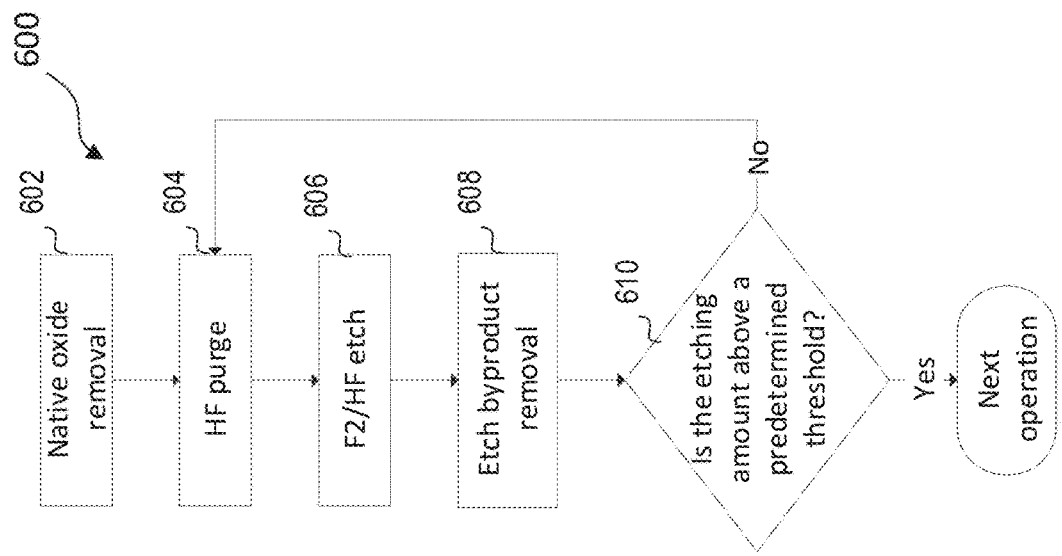
Figure 6A:
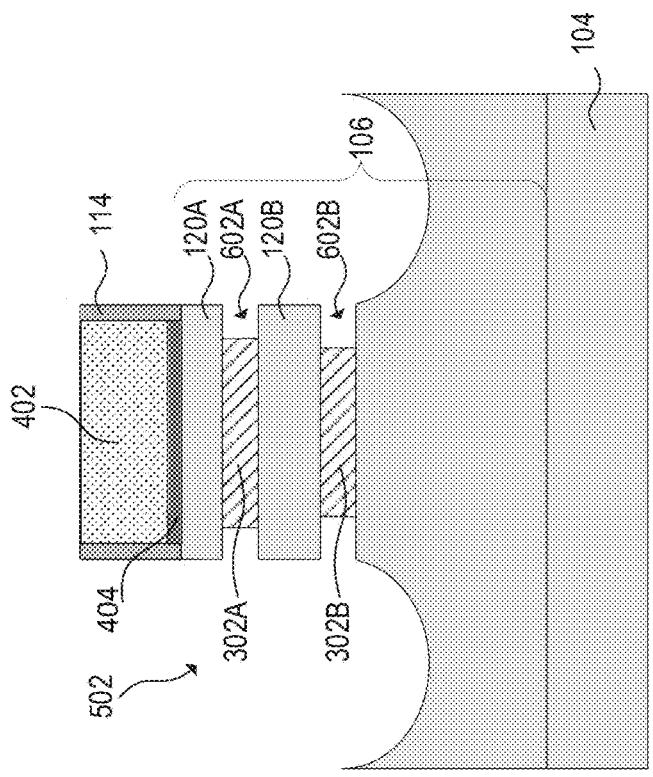

Referring to FIG. 2, in operation 208, the ends of the first-type nanostructures are etched. For example, as shown in FIG. 6A, the ends of first-type nanostructures 302A and 302B are etched to form inner spacer openings 602A and 602B. FIG. 6B is a flow diagram describing a method 600 for etching the ends of first-type nanostructures 302A and 302B.

Referring to FIG. 6B, in operation 602, the native oxide on the surfaces of first-type nanostructures 302A and 302B and nanostructured channel layers 120A and 120B can be removed. The native oxide can be removed by dry chemical etching. In some embodiments, the dry etching is not plasma-enhanced. The native oxide removal operation can remove the native oxide on the surfaces of the SiGe nanostructures to expose SiGe for etching. Removing the native oxide can improve the etching uniformity.

Referring to FIG. 6B, in operation 604, a HF purge can be performed in the etching chamber. The flow rate of HF can be between about 20 sccm and about 200 sccm. The HF purge operation can remove the residues resulting from the native oxide removal operation. The HF purge operation can treat the surfaces of the SiGe nanostructures. The treatment of the surfaces of the SiGe nanostructures can improve etch uniformity and improve the surface roughness after etching.

Referring to FIG. 6B, in operation 606, the ends of first-type nanostructures 302A and 302B can be etched by a $F_2$/HF etch. The $F_2$/HF etch can have a higher etching selectivity towards first-type nanostructures 302A and 302B than nanostructured channel layers 120A and 120B. In some embodiments, the $F_2$/HF etch operation can be a chemical etching process without plasma enhancement (e.g., a non-plasma etching process). The substrate to be etched can be maintained at a temperature between about −20° C. and about 40° C., between about −30° C. and about 50° C., and between about −40° C. and about 60° C. The temperature of the substrate can be controlled by an electrostatic chuck. The electrostatic chuck can secure the substrate with an electrostatic mechanism and provide temperature control by supplying a cooling gas. If the substrate temperature is greater than about 60° C., Si nanostructured channel layer loss can be too great. If the substrate temperature is lower than about −40° C., the etching rate of first-type nanostructures 302A and 302B can be too low. The temperature of the etching chamber can be between about 50° C. and about 150° C.

The $F_2$ etchant gas can be supplied with a flow rate between about 80 sccm and about 120 sccm, between about 60 sccm and about 140 sccm, and between about 50 sccm and about 150 sccm. If the $F_2$ etchant gas flow rate is lower than about 50 sccm, the etching rate of first-type nanostructures 302A and 302B can be too low. If the $F_2$ etchant gas flow rate is greater than about 150 sccm, the surface roughness of etched first-type nanostructures 302A, 302B, and 120B can be too great. The HF gas can be supplied with a flow rate between about 30 sccm and about 50 sccm, between about 20 sccm and about 60 sccm, and between about 10 sccm and about 70 sccm. If the HF gas flow rate is lower than about 10 sccm, the surface roughness of etched first-type nanostructures 302A, 302B, and 120B can be too great. If the HF gas flow rate is greater than about 70 sccm, the etching non-uniformity of first-type nanostructures 302A and 302B can be too great.

The pressure of the $F_2$/HF etchant gas mixture in the etching chamber can be maintained between about 0.2 Torr and about 0.6 Torr, between about 0.15 Torr and about 0.7 Torr, and between about 0.1 Torr and about 0.8 Torr. If the pressure is lower than about 0.1 Torr, the etching rate of first-type nanostructures 302A and 302B can be too low. If the pressure is greater than about 0.8 Torr, the etching non-uniformity of first-type nanostructures 302A and 302B can be too great. A ratio between $F_2$ and HF gases can be between about 0.04 and about 0.4, between about 0.03 and about 0.5, and between about 0.02 and about 0.6. In some embodiments, diluted $F_2$ with either Ar or $N_2$ can be used with the $F_2$/Ar or $F_2$/$N_2$ volume ratio between about 10% and about 30%. The ratio between $F_2$ and HF is calculated with the actual $F_2$ flowrate applied, not the flowrate of the $F_2$/Ar or $F_2$/$N_2$ gas mixture. If the ratio between $F_2$ and HF is greater than about 0.6, the surface roughness of etched first-type nanostructures 302A, 302B, and 120B can be too great. If the ratio between $F_2$ and HF is lower than about 0.02, the etching non-uniformity of first-type nanostructures 302A and 302B can be too great. In some embodiments, a ratio between a carrier gas, such as argon (Ar) and nitrogen ($N_2$), and the $F_2$/HF etchant gas mixture can be between about 2.5 and about 3, between about 2 and about 3.5, and between about 1.5 and about 4. If the ratio between the carrier gas and the etchant gas mixture is lower than about 1.5, the surface roughness of etched first-type nanostructures 302A, 302B, and 120B can be too great. If the ratio between the carrier gas and the etchant gas mixture is greater than about 4, the etching non-uniformity of first-type nanostructures 302A and 302B can be too great.

Referring to FIG. 6B, in operation 608, etch byproducts in the exhaust gas mixture can be removed. The etch byproduct removal operation can remove the byproducts generated in the $F_2$/HF etch operation. The etching byproducts can include silicon tetrafluoride ($SiF_4$), germanium tetrafluoride ($GeF_4$), silicon trifluoride ($SiF_3$), germanium trifluoride ($GeF_3$), silicon difluoride ($SiF_2$ and $SiHF_2$), difluorosilane ($SiH_2F_2$), germanium difluoride ($GeF_2$ and $GeHF_2$), difluorogermane ($GeH_2F_2$), silicon fluoride ($SiH_2F$ and $SiHF$), fluorosilane ($SiH_3F$), germanium fluoride ($GeH_2F$ and $GeHF$), fluorogermane ($GeH_3F$), and combinations thereof. The etch byproduct removal operation can be performed by a vacuum mechanism. In some embodiments, the etch byproduct removal operation can be performed by reducing the pressure in the etching chamber with a vacuum pump. In some embodiments, residual $F_2$/HF can remain in the etching chamber after the $F_2$/HF etch operation. The etch byproduct removal operation can remove the residual $F_2$/HF and ensure that the ratio between $F_2$ and HF for the next etching cycle is within the predetermined range. The etch byproduct removal operation can improve etching uniformity and surface roughness.

Referring to FIG. 6B, in operation 610, after a cycle of HF purge, $F_2$/HF etch, and etch byproduct removal, the etching amount can be compared to a predetermined threshold. If the etching amount is equal to or greater than the predetermined threshold, the desired etching amount is reached and the substrate can continue to the next operation. If the etching amount is below the predetermined threshold, one or more additional cycles of HF purge, $F_2$/HF etch, and etch byproduct removal can be performed until the desired etching amount is reached. Each cycle can be between about 1 second and about 150 seconds. A total number of cycles can be between about 1 cycle and about 10 cycles. Multiple cycles of low-temperature and low-pressure etching for each cycle can reduce the etching and CD non-uniformities. The inner spacer to be formed in the space previously occupied by first-type nanostructures 302A and 302B can have improved uniformity, and less voids can be formed between the inner spacer and the remaining first-type nanostructures 302A and 302B. Substantially uniform inner spacers can result in substantially uniform gate regions, which can improve device performance and reliability.

Figure 6C:
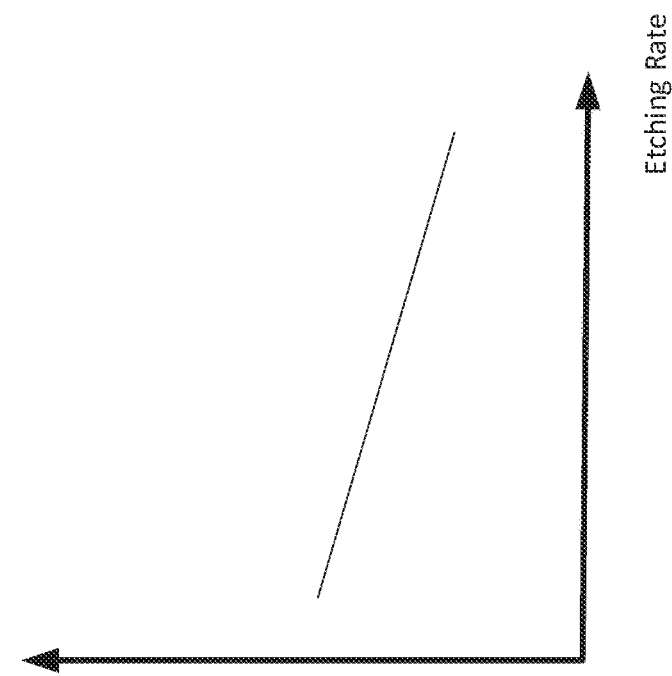
Figure 6D:
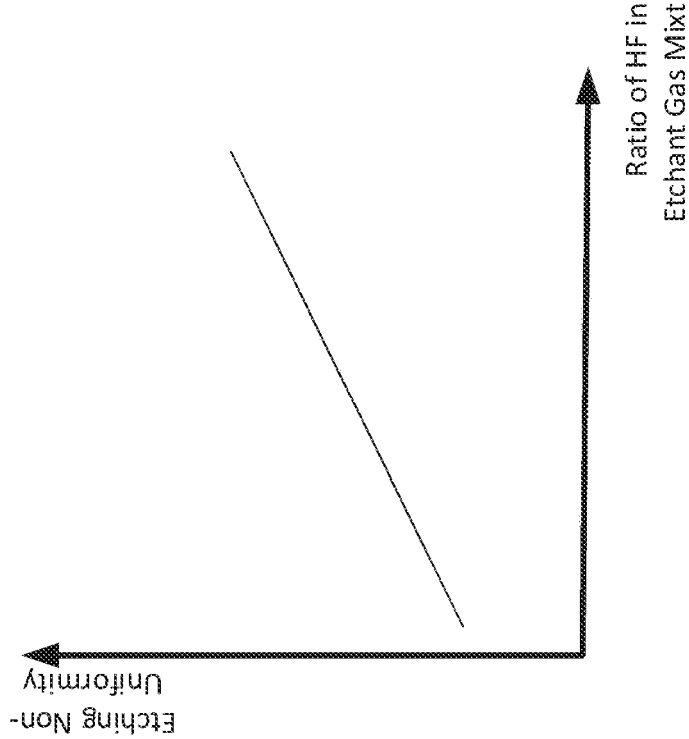
Figure 6F:
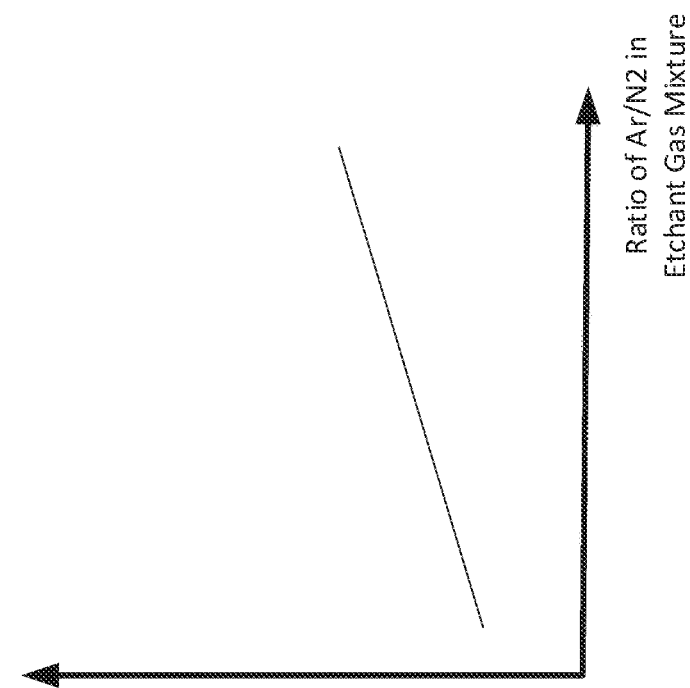
Figure 6E:
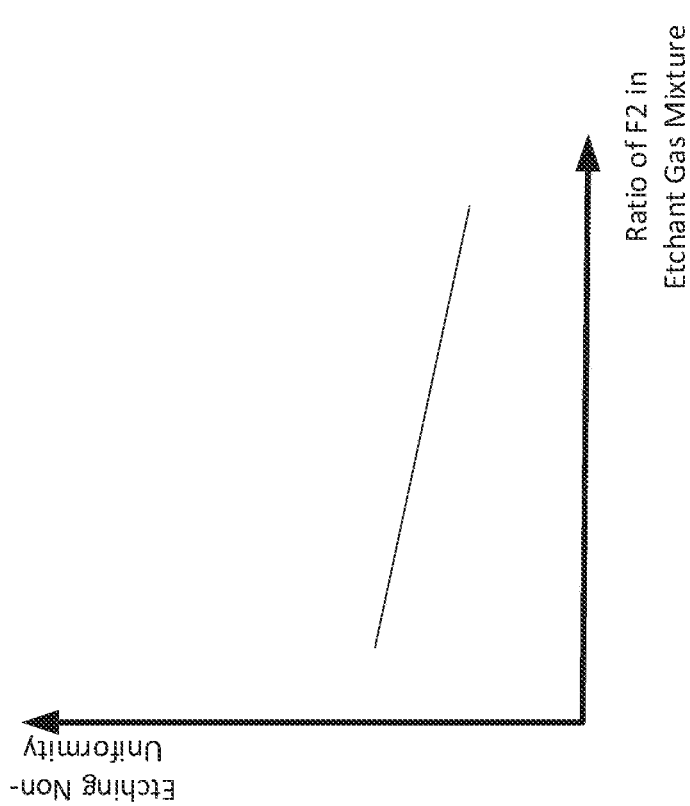

FIGS. 6C-6F illustrate correlations between etching non-uniformity and various factors, in accordance with some embodiments. Referring to FIG. 6C, a higher ratio of HF in the etchant gas mixture can lead to higher etching non-uniformity and a lower ratio of HF in the etchant gas mixture can lead to lower etching non-uniformity. Referring to FIG. 6D, a higher etching rate can lead to lower etching non-uniformity and a lower etching rate can lead to higher etching non-uniformity. Referring to FIG. 6E, a higher ratio of $F_2$ in the etchant gas mixture can lead to lower etching non-uniformity and a lower ratio of $F_2$ in the etchant gas mixture can lead to higher etching non-uniformity. A higher ratio of $F_2$ in the etchant gas mixture can also lead to higher etched surface roughness. Referring to FIG. 6F, a higher ratio of the carrier gas in the etchant gas mixture can lead to higher etching non-uniformity and a lower ratio of the carrier gas in the etchant gas mixture can lead to lower etching non-uniformity.

Figure 7:
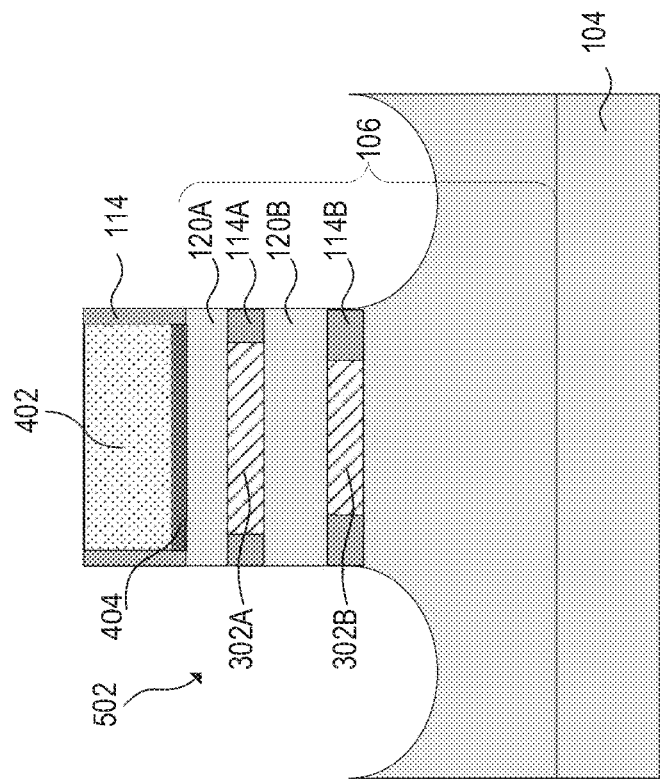

Referring to FIG. 2, in operation 210, an inner spacer is formed at the ends of each of the first-type nanostructures. For example, as shown in FIG. 7, inner spacers 114A and 114B are formed at the ends of each of first-type nanostructures 302A and 302B. The formation of inner spacers 114A and 114B can include filling inner spacer openings 602A and 602B with a dielectric material using CVD and ALD.

Figure 8:
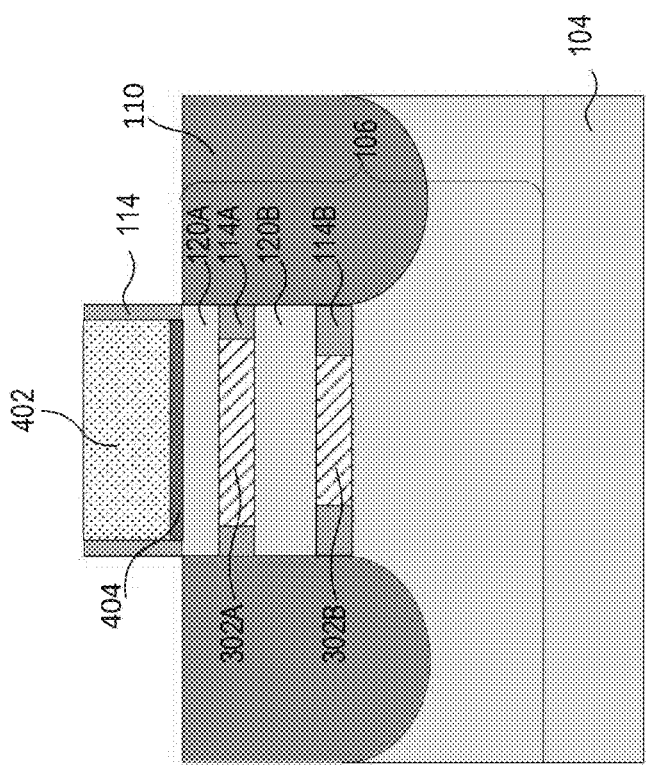

Referring to FIG. 2, in operation 212, a S/D region is formed in the removed portions of the fin structure. For example, as shown in FIG. 8, S/D regions 110 are formed on opposite sides of polysilicon structure 402 in recess openings 502. By way of example and not limitation, S/D regions 110 can be epitaxially grown using source gases, such as silane ($SiH_4$), silicon tetrachloride ($SiCl_4$), trichlorosilane (TCS), and dichlorosilane ($SiH_2Cl_2$ and DSC). Hydrogen ($H_2$) can be used as a reactant gas to reduce the aforementioned source gases. For example, $H_2$ can combine with Cl to form hydrogen chloride (HCl), leaving Si to epitaxially grow in S/D regions 110. The growth temperature during the epitaxial growth can range from about 700° C. to about 1250° C. depending on the gases used. According to some embodiments, S/D regions 110 can have the same crystallographic orientation as substrate 104 and fin structures 106 since substrate 104 and fin structures 106 can act as a seed layer for S/D regions 110. In some embodiments, a top surface of S/D regions 110 can be parallel to the (100) crystal plane. S/D regions 110 can be in-situ doped during their epitaxial growth process using p-type dopants, such as B, In, and Ga, or n-type dopants, such as P and As. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and other n-type doping precursors can be used.

Figure 9:
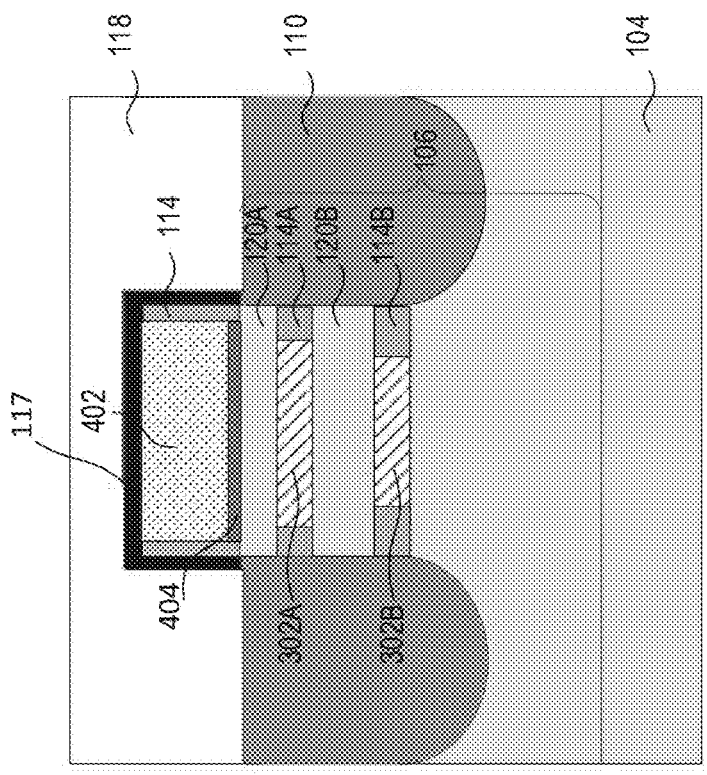

Referring to FIG. 2, in operation 214, an ESL and an ILD layer can be deposited on the spacer and on the S/D regions. For example, as shown in FIG. 9, ESL 117 and ILD layer 118 are deposited on spacer 114 and S/D regions 110. ESL 117 and ILD layer 118 can be insulating materials deposited using PVD, CVD, and plasma-enhanced chemical vapor deposition (PECVD). In some embodiments, a chemical mechanical polishing/planarization (CMP) process can follow the deposition of ESL 117 and ILD layer 118, such that polysilicon structure 402 can be exposed for removal in the following operation.

Figure 10:
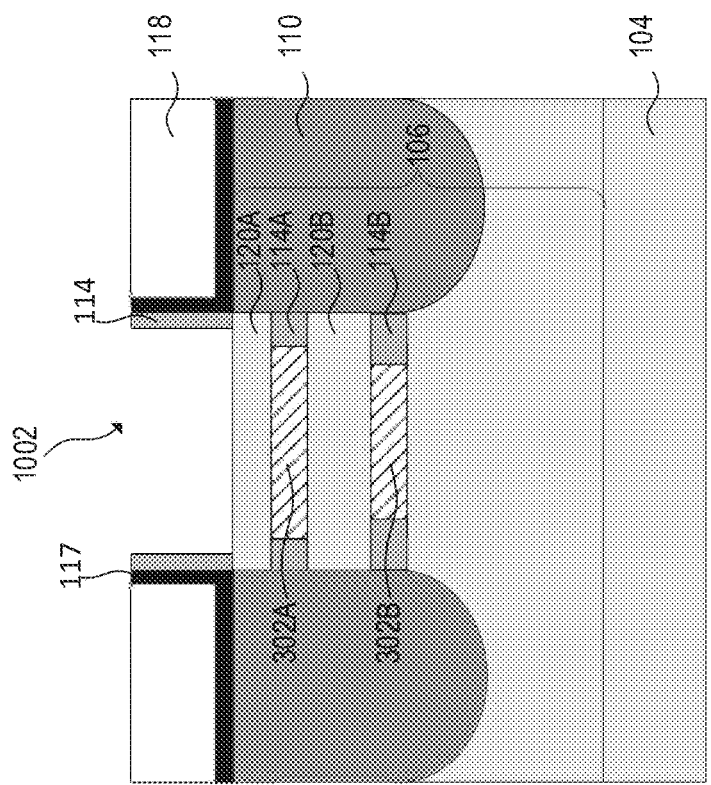

Referring to FIG. 2, in operation 216, the polysilicon structure is removed. In some embodiments, the interfacial oxide layer is also removed. For example, as shown in FIG. 10, polysilicon structure 402 and interfacial oxide layer 404 are removed to form polysilicon opening 1002. Removal of polysilicon structure 402 and interfacial oxide layer 404 can be achieved using a dry etching process (e.g., reactive ion etching) and a wet etching process, each having a higher etching rate towards polysilicon structure 402 and interfacial oxide layer 404 and a lower etching rate towards fin structure 106 and spacer 114. In some embodiments, the gas etchants used in the dry etching process can include Cl, F, bromine (Br), and a combination thereof. In some embodiments, an ammonium hydroxide ($NH_4OH$), sodium hydroxide (NaOH), and potassium hydroxide (KOH) wet etching can be used to remove polysilicon structure 402 and interfacial oxide layer 404.

Figure 11B:
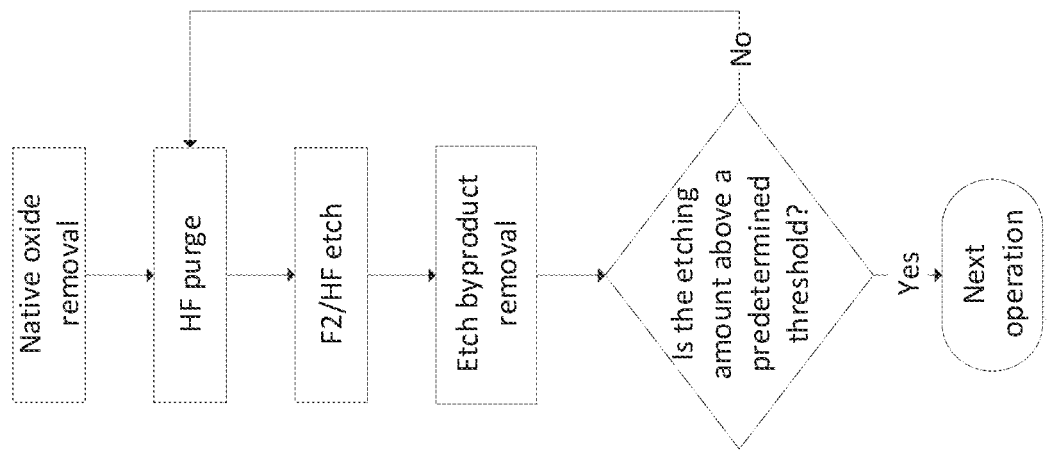
Figure 11A:
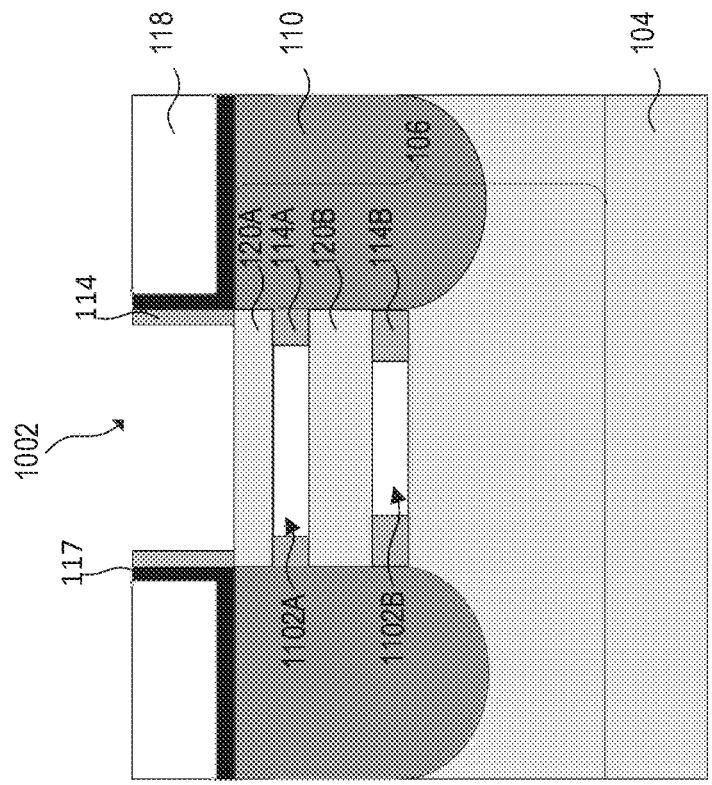

Referring to FIG. 2, in operation 218, the middle portions of the first-type nanostructures of the fin structure are removed. For example, as shown in FIG. 11A, the middle portions of first-type nanostructures 302A and 302B of fin structure 106 are removed to form first-type nanostructure openings 1102A and 1102B. Removal of the middle portions of first-type nanostructures 302A and 302B can be achieved using a dry etching process (e.g., reactive ion etching) and a wet etching process, each having a higher etching rate towards the middle portions of first-type nanostructures 302A and 302B and a lower etching rate towards fin structure 106 and inner spacers 114A and 114B. In some embodiments, the middle portions of first-type nanostructures 302A and 302B can be etched in a manner similar to the polysilicon structure etching described with reference to FIG. 10. In some embodiments, the middle portions of first-type nanostructures 302A and 302B can be etched according to the etching operations shown in FIG. 11B, which is in a manner similar to that described with reference to FIG. 6A and operations 602-610 of FIG. 6B. Multiple cycles of low-temperature and low-pressure etching for each cycle can reduce the etching non-uniformity. Reduced etching non-uniformity can improve uniformity in the gate regions, which can lead to improved device performance and reliability.

Figure 12:
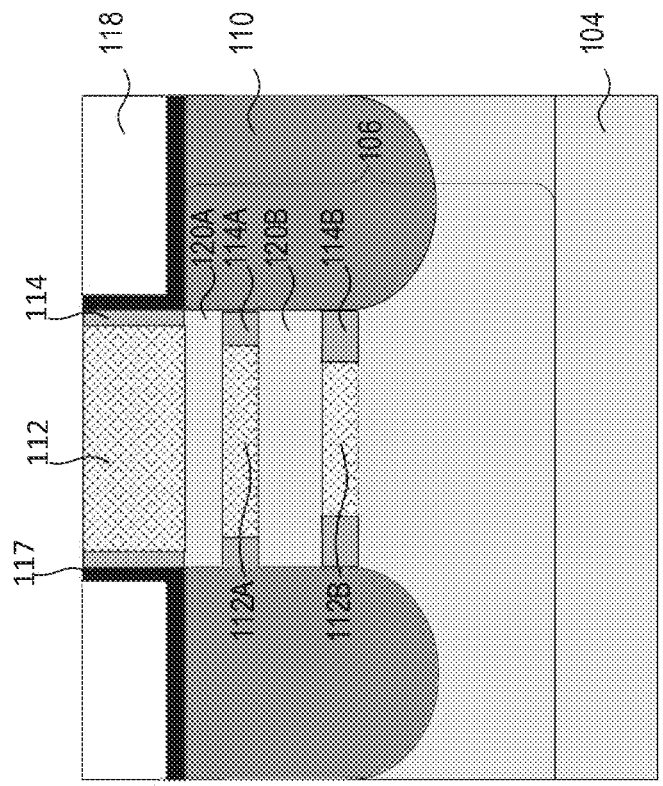

Referring to FIG. 2, in operation 220, a gate structure is formed in the space previously occupied by the polysilicon structure. Gate regions are also formed in the space previously occupied by the middle portions of the first-type nanostructures. The gate regions can have improved uniformity if the etching non-uniformity is lower. For example, as shown in FIG. 12, gate structures 112 are formed in polysilicon openings 1002. Gate regions 112A and 112B are also formed in first-type nanostructure openings 1102A and 1102B. Gate structures 112 and gate regions 112A and 112B can include a multi-layered structure with IO layer, HK gate dielectric layer, WFM layer, and gate metal fill layer. These layers are not shown in FIG. 12 for simplicity. The IO layer can be deposited using PECVD, CVD, and ALD. The HK gate dielectric layer can be deposited using PECVD, CVD, PVD, and ALD. The WFM layer can be deposited by PECVD, CVD, PVD, ALD, metal organic chemical vapor deposition (MOCVD), sputtering, other suitable deposition methods, and a combination thereof. The gate metal fill layer can be formed by PECVD, CVD, PVD, ALD, MOCVD, sputtering, other suitable deposition methods, and a combination thereof. Because inner spacers 114A and 114B and gate regions 112A and 112B have improved uniformity with multiple cycles of low-temperature and low-pressure etching for each cycle, device performance and reliability are improved.

The present disclosure provides example FET devices (e.g., FET 100, GAA FETs, finFETs, and planar FETs) with substantially uniform gate regions (e.g., gate regions 112A-

112C) in a semiconductor device and/or in an integrated circuit (IC) and an example method (e.g., method 200) for fabricating the same. Substantially uniform gate regions can be formed when the etching and CD non-uniformities are reduced. The etching and CD non-uniformities can be reduced by adjusting the etching processes. When etching the ends of the SiGe nanostructures, a native oxide removal operation (e.g., operation 602) can be performed to remove the native oxide on the surfaces of the SiGe nanostructures to expose SiGe for etching. Removing the native oxide can improve the etching uniformity. A HF purge operation (e.g., operation 604) can be performed to remove the residues resulting from the native oxide removal operation. The HF purge operation can treat the surfaces of the SiGe nanostructures. The treatment of the surfaces of the SiGe nanostructures can improve etch uniformity and improve the surface roughness after etching. A $F_2$/HF etch operation (e.g., operation 606) can be performed to remove the ends and the middle portions of the SiGe nanostructures. The substrate to be etched can be maintained at a low temperature such that Si nanosheet/nanowire channel loss can be reduced. The $F_2$/HF etchant gas mixture can be supplied at a low rate and the pressure in the etching chamber can be maintained at a low pressure such that the etching and CD non-uniformities can be reduced and the SiGe surface and Si/SiGe interface roughness can be improved. The ratio between $F_2$ and HF can be between about 0.02 and about 0.6. In some embodiments, diluted $F_2$ with either Ar or $N_2$ can be used with the $F_2$/Ar or $F_2$/$N_2$ volume ratio between about 10% and about 30%. The ratio between $F_2$ and HF is calculated with the actual $F_2$ flowrate applied, not the flowrate of the $F_2$/Ar or $F_2$/$N_2$ gas mixture. If the ratio between $F_2$ and HF is greater than about 0.6, the SiGe surface and Si/SiGe interface roughness can be too great. If the ratio between $F_2$ and HF is lower than about 0.02, the etching and CD non-uniformities can be too great. An etch byproduct removal operation (e.g., operation 608) can be performed to remove the byproducts generated in the $F_2$/HF etch operation. The etch byproduct removal operation can be performed by a vacuum mechanism. The etch byproduct removal operation can improve etching uniformity and surface roughness.

After a cycle of HF purge, $F_2$/HF etch, and etch byproduct removal, if the etching amount is below a predetermined threshold, one or more additional cycles of HF purge, $F_2$/HF etch, and etch byproduct removal can be performed (e.g., operation 610). In some embodiments, residual $F_2$/HF can remain in the etching chamber after the $F_2$/HF etch operation. The etch byproduct removal operation can remove the residual $F_2$/HF and ensure that the ratio between $F_2$ and HF for the next cycle is within the predetermined range. Multiple cycles of low-temperature and low-pressure etching for each cycle can reduce the etching and CD non-uniformities. Reduced etching non-uniformity can result in less voids when the inner spacer is formed. Both the inner spacer and the gate regions to be formed in the space previously occupied by the SiGe nanostructures can have improved uniformity. Substantially uniform gate regions can improve device performance and reliability.

In some embodiments, a method includes forming a fin structure on a substrate, the fin structure including one or more nanostructures. The method further includes removing a portion of the fin structure to expose an end of the one or more nanostructures and etching the end of the one or more nanostructures with one or more etching cycles. Each etching cycle includes purging the fin structure with hydrogen fluoride (HF), etching the end of the one or more nanostructures with a gas mixture of fluorine ($F_2$) and HF, and removing an exhaust gas mixture including an etching byproduct. The method further includes forming an inner spacer in the etched end of the one or more nanostructures.

In some embodiments, a method includes forming a fin structure on a substrate, the fin structure including one or more nanostructures. The method further includes etching an end of the one or more nanostructures with one or more etching cycles, each etching cycle including purging the fin structure with hydrogen fluoride (HF) and etching the end of the one or more nanostructures with a gas mixture of fluorine ($F_2$) and HF. The method further includes forming an inner spacer in the etched end of the one or more nanostructures, etching a middle portion of the one or more nanostructures with the one or more etching cycles, and forming a gate region in the etched middle portion of the one or more nanostructures.

In some embodiments, a semiconductor device includes a fin structure disposed on a substrate, where the fin structure includes a first gate region above a second gate region, and where a ratio between a first width of the first gate region and a second width of the second gate region is between about 0.9 and about 1.1. The semiconductor device further includes a gate structure disposed on the fin structure, a source/drain (S/D) region disposed on a portion of the fin structure and adjacent to the gate structure, and a spacer interposed between the gate structure and the S/D region. The semiconductor device further includes an inner spacer interposed between the first and second gate regions and the S/D region.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure on a substrate, the fin structure comprising one or more nanostructures;
    removing a portion of the fin structure to expose an end of the one or more nanostructures;
    etching a portion of the end of the one or more nanostructures with one or more etching cycles, each etching cycle comprising:
        removing a portion of a native oxide of the nanostructure with an etching process;
        removing a remaining portion of the native oxide by purging the fin structure with hydrogen fluoride (HF);
        etching the end of the one or more nanostructures with a gas mixture of fluorine ($F_2$) and HF; and
        removing an exhaust gas mixture comprising an etching byproduct;

in response to the etched portion of the end of the one or more nanostructures being below a predetermined threshold, performing the one or more etching cycles until a desired etched portion of the end of the one or more nanostructures is reached; and forming an inner spacer in the etched end of the one or more nanostructures.

2. The method of claim 1, wherein etching the end of the one or more nanostructures with the one or more etching cycles comprises performing a non-plasma etching process.

3. The method of claim 1, wherein a ratio between $F_2$ and HF in the gas mixture is between about 0.02 and about 0.6.

4. The method of claim 1, wherein etching the end of the one or more nanostructures with the one or more etching cycles comprises setting a pressure in an etching chamber performing the one or more etching cycles between about 0.2 Torr and about 0.6 Torr.

5. The method of claim 1, wherein etching the end of the one or more nanostructures with the gas mixture comprises flowing $F_2$ between about 50 sccm and 150 sccm and flowing HF of the gas mixture between about 10 sccm and about 70 sccm.

6. The method of claim 1, wherein a first nanostructure of the one or more nanostructures is above a second nanostructure of the one or more nanostructures, and wherein etching the end of the one or more nanostructures with the one or more etching cycles comprises etching a different amount of a first end of the first nanostructure from a second end of the second nanostructure.

7. The method of claim 1, further comprising:
forming an other fin structure comprising one or more other nanostructures on the substrate, wherein a spacing between the fin structure and an adjacent fin structure is smaller than an other spacing between the other fin structure and an other adjacent fin structure; and
etching an end of the one or more other nanostructures with the one or more etching cycles, wherein an etched amount of the end of the one or more other nanostructures is different than that of the one or more nanostructures.

8. The method of claim 1, wherein removing the exhaust gas mixture comprises reducing a pressure in an etching chamber performing the one or more etching cycles by a vacuum pump.

9. The method of claim 1, further comprising:
etching a middle portion of the one or more nanostructures with the one or more etching cycles; and
forming a gate region in the etched middle portion of the one or more nanostructures.

10. The method of claim 1, further comprising:
forming a gate structure over the fin structure, comprising:
depositing an interfacial oxide (IO) layer;
depositing a high-k (HK) gate dielectric layer on the IO layer;
depositing a work function metal (WFM) layer on the HK gate dielectric layer; and
depositing a gate metal fill layer on the WFM layer;
forming a spacer on the gate structure; and
forming a source/drain (S/D) region in the removed portion of the fin structure and adjacent to the gate structure.

11. A method, comprising:
forming a fin structure on a substrate, the fin structure comprising one or more nanostructures;

etching a portion of an end of the one or more nanostructures with one or more etching cycles, each etching cycle comprising:
removing a portion of a native oxide of the nanostructure with an etching process;
removing a remaining portion of the native oxide by purging the fin structure with hydrogen fluoride (HF); and
etching the end of the one or more nanostructures with a gas mixture of fluorine ($F_2$) and HF;
in response to the etched portion of the end of the one or more nanostructures being below a predetermined threshold, performing the one or more etching cycles until a desired etched portion of the end of the one or more nanostructures is reached;
forming an inner spacer in the etched end of the one or more nanostructures;
etching a middle portion of the one or more nanostructures with the one or more etching cycles; and
forming a gate region in the etched middle portion of the one or more nanostructures.

12. The method of claim 11, wherein etching the end of the one or more nanostructures with the one or more etching cycles comprises performing a non-plasma etching process.

13. The method of claim 11, wherein a ratio between $F_2$ and HF in the gas mixture is between about 0.02 and about 0.6.

14. The method of claim 11, wherein etching the end of the one or more nanostructures with the one or more etching cycles comprises setting a pressure in an etching chamber performing the one or more etching cycles between about 0.2 Torr and about 0.6 Torr.

15. The method of claim 11, further comprising removing an exhaust gas mixture comprising an etching byproduct, wherein removing the exhaust mixture comprises removing one or more of silicon tetrafluoride ($SiF_4$), germanium tetrafluoride ($GeF_4$), silicon trifluoride ($SiF_3$), germanium trifluoride ($GeF_3$), silicon difluoride ($SiF_2$ and $SiHF_2$), difluorosilane ($SiH_2F_2$), germanium difluoride ($GeF_2$ and $GeHF_2$), difluorogermane ($GeH_2F_2$), silicon fluoride ($SiH_2F$ and SiHF), fluorosilane ($SiH_3F$), germanium fluoride ($GeH_2F$ and GeHF), fluorogermane ($GeH_3F$), and combinations thereof.

16. The method of claim 11, wherein the fin structure further comprises one or more nanostructured channel layers above, below, and interposed between the one or more nanostructures, and wherein the method further comprises:
forming a shallow trench isolation (STI) region at a bottom portion of the fin structure;
forming a gate structure over the fin structure;
forming a spacer on the gate structure;
forming a source/drain (S/D) region on a portion of the fin structure and adjacent to the gate structure; and
forming an etch stop layer (ESL) and an interlayer dielectric (ILD) layer on the S/D region and on a sidewall of the spacer.

17. A method, comprising:
forming a fin structure on a substrate, the fin structure comprising one or more nanostructures;
removing a portion of the fin structure to expose an end of the one or more nanostructures; and
etching a portion of the end of the one or more nanostructures with one or more etching cycles, each etching cycle comprising:
removing a portion of an oxide of the nanostructure with an etching process;

removing a remaining portion of the oxide by purging the fin structure with hydrogen fluoride (HF);

etching the end of the one or more nanostructures with a gas mixture of fluorine ($F_2$) and HF; and in response to the etched portion of the end of the one or more nanostructures being below a predetermined threshold, performing the one or more etching cycles until a desired etched portion of the end of the one or more nanostructures is reached.

18. The method of claim 17, wherein etching the end of the one or more nanostructures with the one or more etching cycles comprises performing a chemical etching process without plasma enhancement.

19. The method of claim 17, wherein a ratio between $F_2$ and HF in the gas mixture is between about 1 and about 50.

20. The method of claim 17, wherein etching the end of the one or more nanostructures with the one or more etching cycles comprises setting a pressure in an etching chamber performing one or more etching cycles between about 0.2 Torr and about 0.6 Torr.

* * * * *